United States Patent
Nakamura et al.

(10) Patent No.: US 8,222,527 B2
(45) Date of Patent: Jul. 17, 2012

(54) MULTILAYERED WIRING BOARD AND METHOD FOR FABRICATING THE SAME

(75) Inventors: Junichi Nakamura, Nagano (JP); Yuji Kobayashi, Nagano (JP); Mikio Yamagiwa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 1152 days.

(21) Appl. No.: 11/509,723

(22) Filed: Aug. 25, 2006

(65) Prior Publication Data

US 2007/0119619 A1 May 31, 2007

(30) Foreign Application Priority Data

Aug. 29, 2005 (JP) ................. P. 2005-247862
Apr. 26, 2006 (JP) ................. P. 2006-122115

(51) Int. Cl.
H05K 1/03 (2006.01)
H05K 3/36 (2006.01)
(52) U.S. Cl. .......................... 174/255; 29/830
(58) Field of Classification Search .......... 29/830; 174/255, 262–266; 361/792–795
See application file for complete search history.

(56) References Cited

U.S. PATENT DOCUMENTS

| 6,531,661 | B2  |   | 3/2003 | Uchikawa et al. |
|-----------|-----|---|--------|-----------------|
| 6,591,491 | B2  | * | 7/2003 | Fujii et al. ........................ 29/830 |
| 6,703,564 | B2  |   | 3/2004 | Mori |
| 2004/0074088 | A1 | * | 4/2004 | Nakamura et al. ............. 29/831 |
| 2004/0126516 | A1 | * | 7/2004 | Kishimoto et al. .......... 428/34.1 |
| 2005/0006744 | A1 |   | 1/2005 | Ooi et al. ....................... 257/686 |
| 2005/0126818 | A1 | * | 6/2005 | Kojima et al. ................ 174/255 |

FOREIGN PATENT DOCUMENTS

| CN | 1541054      | 10/2004 |
| JP | 11-074641    | 3/1999  |
| JP | 2002-246760  | 8/2002  |
| JP | 2004-152904  | 5/2004  |
| JP | 2004-186265  | 7/2004  |
| JP | 2004-319888  | 11/2004 |
| JP | 2005-109108  | 4/2005  |
| WO | 03/039219    | 5/2003  |

OTHER PUBLICATIONS

Korean Intellectual Property Office, Notice of Preliminary Rejection in Application 10-2006-0079186, Date mailed: Mar. 19, 2012.*

* cited by examiner

Primary Examiner — Jeremy Norris
(74) Attorney, Agent, or Firm — Drinker Biddle & Reath LLP (57) ABSTRACT

In a multilayered wiring board constituted by laminating to form pluralities of layers of wiring layers 105, 108, 110 and insulating layers 104, 106, 107, in the plurality of laminated insulating layers 104, 106, 107, the insulating layer 106 disposed at a laminating center in a laminating direction is made to constitute an insulating layer with a reinforcing member including a reinforcing member.

23 Claims, 11 Drawing Sheets

RELATED ART

MULTILAYERED WIRING BOARD AND METHOD FOR FABRICATING THE SAME

BACKGROUND OF THE INVENTION

The present invention relates to a multilayered wiring board and a method for fabricating the same, particularly relates to a multilayered wiring board provided with reinforcing means for preventing warp and a method for fabricating the same.

Currently, high function formation and small-sized formation of an electronic apparatus using a semiconductor device of a semiconductor chip or the like has been progressed, also a semiconductor device is constituted by high density formation in accordance therewith, and multipins formation and small-sized formation thereof have been achieved. As a board mountable with a semiconductor device constituted by multipins formation and small-sized formation in this way, a multilayered wiring board utilizing a build-up method is provided.

A multilayered wiring board of this kind is constructed by a constitution constituting a core layer by a reinforcing member of a glass cloth copper plated laminated plate or the like and formed with an insulating layer and a wiring layer alternately at both faces thereof. The multilayered wiring board of the constitution can be mounted with a semiconductor device constituted by high density formation since a wiring layer thereof can be formed to be miniaturized.

However, since the multilayered wiring board includes the core layer at inside thereof, it is difficult to miniaturize a penetrated through hole formed at the core layer to pose a problem that high density of a total of the multilayered wiring board cannot be achieved. Further, there is also posed a problem that by providing the core layer, the multilayered wiring board becomes necessarily thick to hamper the small-sized formation of an electronic apparatus. Therefore, in recent years, a development of a multilayered wiring board which is not provided with a core layer has been carried out in the multilayered wiring board utilizing the build-up method (refer to Patent Reference 1).

Figure 1:
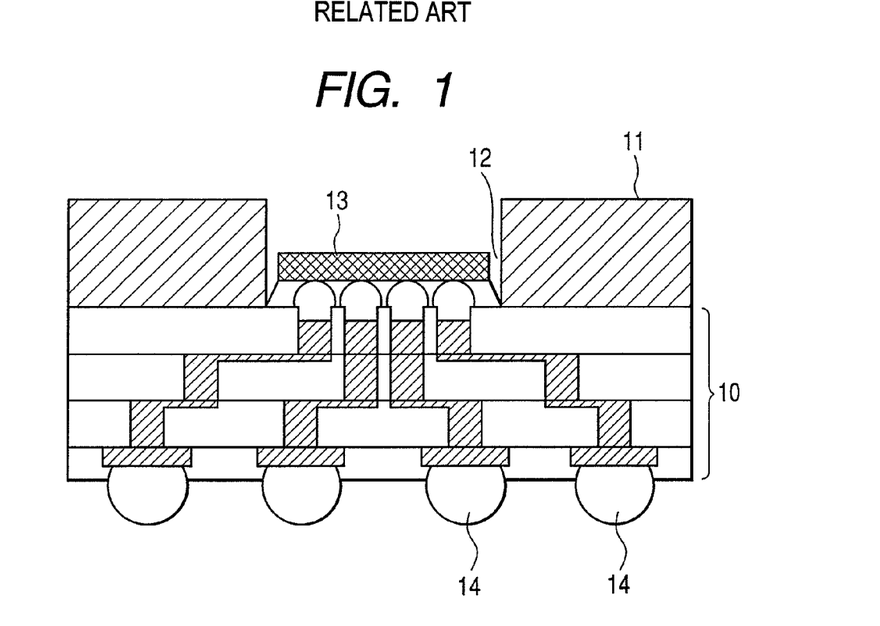
FIG. 1 is a perspective view showing a multilayered wiring board according to a conventional example.

FIG. 1 shows an example of using a multilayered wiring board 10 which is not provided with a conventional core layer as a semiconductor package. The example shown in the drawing is constructed by a constitution of mounting a semiconductor element 13 at an upper portion of the multilayered wiring board 10 and arranging a solder ball 14 at a lower portion thereof. As shown by the drawing, by not forming the core layer, thin-sized formation of the multilayered wiring board 10 can be achieved.

[Patent Reference 1]

Pamphlet of International Patent Publication No. WO2003/039219

However, there poses a problem that by simply removing the core layer functioning as a reinforcing member, warp is brought about at the multilayered wiring board owing to a difference of thermal expansion of the insulating layer made of resin and the wiring layer made of metal. When the warp is brought about, a semiconductor device or the like cannot properly be mounted to the multilayered wiring board in a mounting step to deteriorate mounting reliability. Further, there is a concern that interlayer connection of the wiring layer cannot firmly be carried out at inside of the multilayered wiring board and also reliability of the multilayered wiring board is deteriorated.

Therefore, as shown in FIG. 1, there is proposed also a constitution of arranging a reinforcing plate 11 formed with an opening portion 12 at an area of mounting the semiconductor element 13 of the multilayered wiring board 10 and reinforcing the multilayered wiring board 10 by the reinforcing plate 11. However, according to the multilayered wiring board 10 of the constitution, not only a number of parts is increased but also the multilayered wiring board 10 becomes thick by an amount of a thickness of the reinforcing plate 11.

The invention has been carried out in view of the above-described point and it is an object thereof to provide a multilayered wiring board capable of restraining warp from being brought about while achieving thin-sized formation.

In order to resolve the above-described problem, according to the invention, there is provided a multilayered wiring board including: wiring layers; and insulating layers, wherein the wiring layers and the insulating layers are laminated to form plurality of layers, and some of the plurality of laminated insulating layers are insulating layers including reinforcing members.

According to the invention, warp can be restrained from being brought about at the multilayered wiring board since the multilayered wiring board is interposed with the insulating layer including reinforcing member increasing a strength thereof by the reinforcing member.

Further, the insulating layer with the reinforcing member is constructed by a constitution of mixing the reinforcing member to a material the same as a material of other insulating layer and therefore, the insulating layer including reinforcing member can be formed and worked equivalently to other insulating layer. Therefore, warp can be restrained from being brought about while achieving thin-sized formation of the multilayered wiring board by making portions of the insulating layers constituting the multilayered wiring board function as the reinforcing members without separately providing the reinforcing members.

Further, in the invention, the insulating layer including reinforcing member may be a woven cloth or a nonwoven cloth impregnated by a resin.

Further, in the invention, the insulating layer may be formed by a resin.

Further, in the invention, the insulating layer including reinforcing members may be the resin mixed with reinforcing member.

Further, in the invention, if the plurality of laminated insulating layers are the laminated insulating layers including reinforcing members, an effect of restraining occurrence of warp is further increased.

Further, in order to resolve the above-described problem, according to the invention, there is provided a method of fabricating a multilayered wiring board including the steps of: repeatedly forming a wiring and an insulating layer by using a resin on a support board, and removing the support board, wherein in the steps of forming the insulating layers, at steps of forming portions of the insulating layers, the insulating layers are formed by a resin including a reinforcing member.

According to the invention, at the step of forming portions of the insulating layers, by simply changing the material of the insulating layer to the resin including the reinforcing member, the insulating layer functioning as the reinforcing member can be formed at a laminating center. In this way, only the material (resin) may be changed without changing the laminating step and therefore, even when the resin layer including the reinforcing member is formed at the laminating center, fabricating steps are not complicated.

Further, in the invention, the insulating layer may be made by build-up resin.

Further, if the invention further includes the steps of: pasting together two sheets of the support boards; and separating the two sheets of the support boards respectively formed with the insulating layers and the wirings, an efficiency of fabricating the multilayered wiring board is improved.

Further, if the invention further includes the steps of: respectively pasting two sheets of the support boards to a first face and a second face of a holding board holding the two sheets of the support boards; and separating the two sheets of the support boards respectively formed with the insulating layers and the wirings from the holding board, the efficiency of fabricating the multilayered wiring board is improved.

Further, the invention may further include the step of: mounting a semiconductor chip to the multilayered wiring board.

Further, in the invention, the step of removing the support board may be carried out after the step of mounting the semiconductor chip.

According to the invention, warp can be restrained from being brought about while achieving a thin-sized formation of the multilayered wiring board.

DETAILED DESCRIPTION OF THE PREFERRED EMBODIMENTS

Next, the best mode for carrying out the invention will be explained in reference to the drawings.

Figure 2:
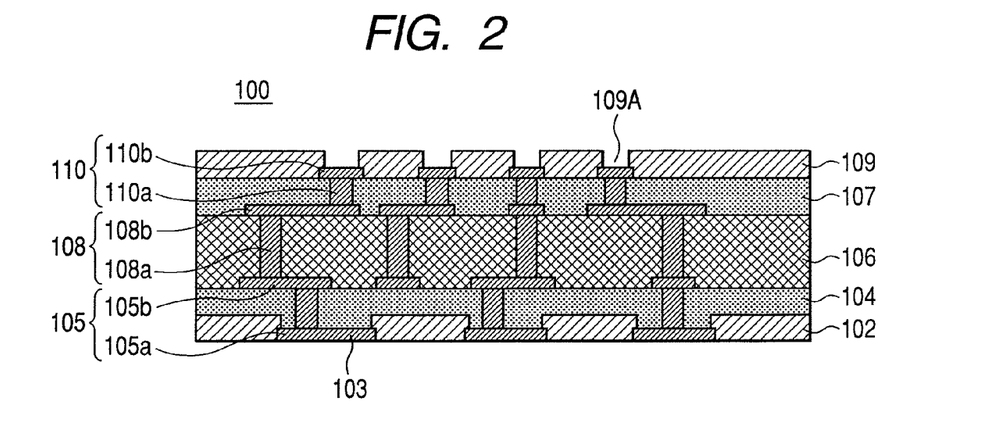
FIG. 2 is a sectional view showing a multilayered wiring board according to an embodiment of the invention.

FIG. 2 shows a multilayered wiring board 100 according to an embodiment of the invention. Further, as shown by the drawing, according to the embodiment, an explanation will be given by taking an example of a 4 layers laminated structure as the multilayered wiring board 100. However, application of the invention is not limited to the 4 layers laminated structure but is widely applicable to a multilayered wiring board having various numbers of layers.

The multilayered wiring board 100 is constructed by a constitution of successively laminating a first insulating layer 104, a wiring 105, a second insulating layer 106, a wiring 108, a third insulating layer 107, and a wiring 110 from a lower layer to an upper layer as a gross classification. A lower face of the first insulating layer 104 is formed with a solder resist 102 and an upper face of the third insulating layer 107 is formed with a solder resist 109.

The first insulating layer 104 and the third insulating layer 107 are made of, for example, a build-up resin of epoxy species having a thermosetting property. Further, the build-up resin is not limited to that having the thermosetting property but a build-up resin having photo sensitivity or other insulating resin can also be used.

Further, the second insulating layer 106 is constructed by a constitution having mechanical strength (rigidity, hardness or the like) higher than those of the insulating layers 104, 107 by putting a reinforcing member to the build-up resin of epoxy species having the thermosetting property similar to those of the respective insulating layers 104, 107. Specifically, the second insulating layer 106 is constituted by an insulating layer including a reinforcing member impregnating the build-up resin to woven cloth or nonwoven cloth of glass, aramid, LCP (Liquid Crystal Polymer) fiber. According to the invention, the second insulating layer 106 promoting the mechanical strength is characterized in being arranged at a center position in a laminating direction (laminating center position). Further, details thereof will be described later for convenience of explanation.

On the other hand, the wiring board 100 is formed by laminating the wirings 105, 108, 110 along with the respective insulating layers 104, 106, 107. The respective wirings 105, 108, 110 are formed by, for example, Cu.

The wiring portion 105 is constituted by a via plug portion 105$a$ and a pattern wiring portion 105$b$. The via plug portion 105$a$ is formed at an opening portion formed at the first insulating layer 104, and an upper face of the first insulating layer 104 in the drawing is formed with the pattern wiring portion 105$b$.

An upper end of the via plug portion 105$a$ in the drawing is connected to the pattern wiring portion 105$b$, and a lower end portion thereof is connected to an electrode 103. The electrode 103 is formed at an opening portion of the solder resist 102 formed at a lower face of the first insulating layer 104. The electrode 103 functions as an external connection terminal and is arranged with a solder ball or the like as necessary (which is not provided in the embodiment).

The wiring 108 is constituted by a via plug portion 108$a$ and a pattern wiring portion 108$b$. The via plug portion 108$a$ is formed at an opening portion formed at the second insulating layer 106, and an upper face of the second insulating layer 106 in the drawing is formed with the pattern wiring portion 108$b$. An upper end of the via plug portion 108$a$ in the drawing is connected to the pattern wiring portion 108$b$, and a lower end portion thereof is connected to the pattern wiring portion 105$b$ of the wiring 105.

The wiring 110 is constituted by a via plug portion 110$a$ and an electrode portion 110$b$. The via plug portion 110$a$ is formed at an opening portion formed at the third insulating layer 107, and an upper face of the third insulating layer 107 in the drawing is formed with the electrode portion 110$b$. A position of the electrode portion 110$b$ is set to an opening portion 109A of the solder resist 109 formed at an upper face of the third insulating layer 107. Therefore, the electrode portion 110$b$ is constructed by a constitution of being exposed from the solder resist 109 by way of the opening portion 109A. The electrode portion 110$b$ functions as an external connection terminal. The electrode portion 110b is connected with, for example, a semiconductor element or the like (which is not provided in the embodiment).

The multilayered wiring board 100 constructed by the above-described constitution is provided with the second insulating layer 106 (insulating layer including reinforcing member) constructed by a constitution having the mechanical strength (rigidity, hardness or the like) higher than those of the insulating layers 104, 107 by including the reinforcing member. Further, the second insulating layer 106 is provided to be disposed at a laminating center of the multilayered wiring board 100 laminated to be formed.

Thereby, the third insulating layer 107 and the wiring 110 arranged above the second insulating layer 106 and the first insulating layer 104 and the wiring 105 arranged therebelow are symmetrically arranged centering on the second insulating layer 106. Thereby, a balance in an up and down direction constituting the center by the second insulating layer 106 of the multilayered wiring board 100 is improved, and warp can be restrained from being brought about at the multilayered wiring board 100.

Further, the second insulating layer 106 is constructed by a constitution of constituting a base by a material the same as a material of the other insulating layers 104, 107 and mixing the reinforcing member thereto. Therefore, the second insulating layer 106 can be formed and worked equivalently to the other insulating layers 104, 107. Therefore, it is not necessary to separately provide the reinforcing member (refer to FIG. 1) as in the background art, and by making the second insulating layer 106 constituting one layer constituting the multilayered wiring board 100 function as the reinforcing member, warp can be restrained from being brought about while achieving thin-sized formation of the multilayered wiring board 100. Further, the multilayered wiring board 100 can be formed by following the build-up method and therefore, thin-sized formation of the multilayered wiring board 100 can be achieved.

Successively, an explanation will be given of a method of fabricating the multilayered wiring board 100 constructed by the above-described constitution in reference to FIG. 3 as follows. Further, constitutions in FIG. 3 in correspondence with constitutions shown in FIG. 2 are attached with the same notations.

Figure 3A:
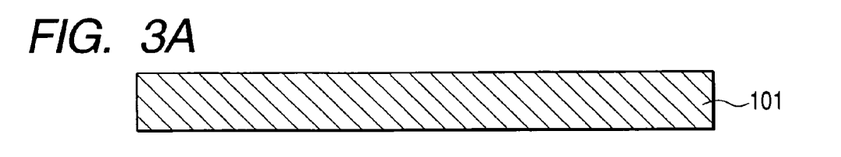
FIGS. 3A to 3E illustrate views for explaining a method of fabricating a multilayered wiring board according to an embodiment of the invention in line with a fabricating procedure.

In fabricating the multilayered wiring board 100, first, a support board 101 shown in FIG. 3A is prepared. The support board 101 is made of a conductive material of, for example, Cu or the like. The solder resist layer 102 made of a photosensitive resin material is formed on the support board 101. In this case, the solder resist layer 102 can be formed by a method of, for example, laminating or coating a photosensitive resin film or the like.

Next, the solder resist layer 102 is patterned by irradiating ultraviolet ray thereto by way of a mask pattern (not illustrated) and exposing the solder resist layer 102 to form an opening portion 102A. There is brought about a state of exposing the support board 101 from the opening portion 102A. Further, the solder resist layer 102 may be formed by printing a thermosetting resin material of epoxy or the like to provide the opening portion 102A by a screen printing method.

Figure 3B:
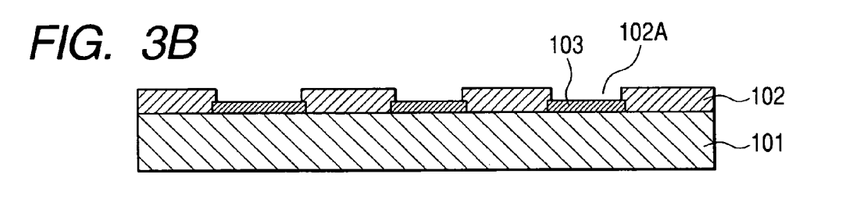

Next, electrolytic plating constituting a conductive path by the support board 101 is carried out to form the electrode 103 made of, for example, Au/Ni (a plated film laminated with an Au layer, Ni layer in this order above the support board 101) at inside of the opening portion 102A formed at the solder resist 102. FIG. 3B shows a state of forming the electrode 103 at inside of the opening portion 102A.

Figure 3C:
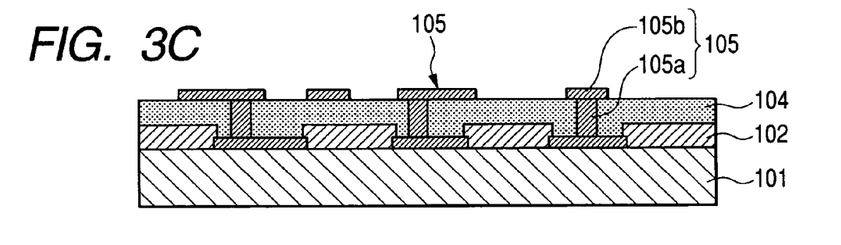

Next, at steps shown in FIG. 3C, the first insulating layer 104 and the wiring 105 are formed. First, the first insulating layer 104 (build-up layer) is formed by coating epoxy resin or the like having a thermosetting property, or laminating a resin film on the solder resist layer 102 and the electrode 103. Next, the first insulating layer 104 is formed with a via hole (opening portion) by using, for example, laser.

Next, the wiring 105 is formed at the first insulating layer 104 by using a plating method. That is, the via plug portion 105a is formed at the via hole of the first insulating layer 104, and the pattern wiring portion 105b connected to the via plug portion 105a is formed on the first insulating layer 104.

Specifically, a seed layer is formed on the first insulating layer 104 by electroless plating, and thereafter, a resist pattern (not illustrated) is formed above the first insulating layer 104 by way of the seed layer by a photolithography method. Next, electricity is fed from the seed layer by constituting a mask by the resist pattern, Cu is precipitated by electrolytic plating, thereafter, the resist pattern and the unnecessary seed layer are removed. Thereby, the wiring 105 including the via plug portion 105a and the pattern wiring portion 105b is formed.

Figure 3D:
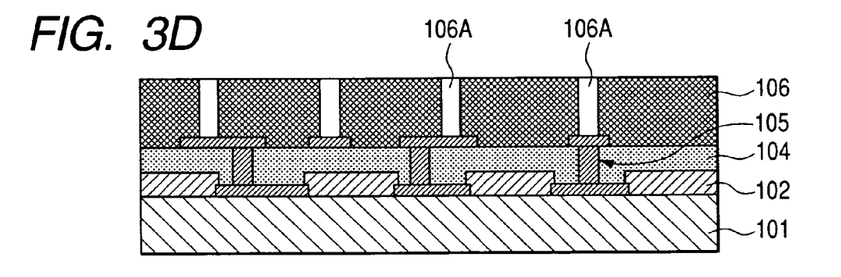

Next, at steps shown in FIG. 3D, there is carried out a processing of forming the second insulating layer 106 on the first insulating layer 104. In order to form the second insulating layer 106, first, a film impregnated with resin is formed at the reinforcing member constituting a base member. Successively, the film is laminated on the first insulating layer 104.

Specifically, by impregnating resin having a thermosetting property of epoxy resin or the like to glass cloth, aramid nonwoven cloth, LCP woven cloth or the like, a resin film including the reinforcing member is fabricated and laminated. The resin including the reinforcing member is arranged on the first insulating layer 104 and the pattern wiring portion 105b. Next, an opening portion 106A (via hole) is formed at the second insulating layer 106 by using, for example, laser.

Further, in place of the method, the reinforcing layer including the reinforcing member may be formed by making respective resin layers of epoxy resin or the like include a filler of silica or the like. In this case, the insulating layer is formed by coating the resin including the filler or laminating the resin film.

Figure 3E:
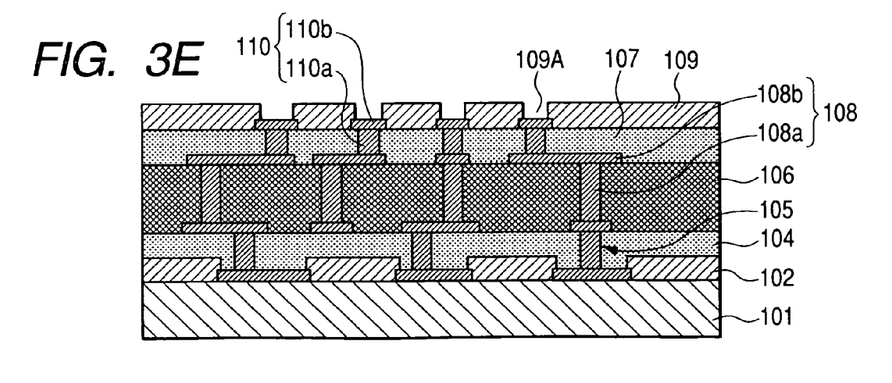

Next, at step shown in FIG. 3E, the wiring 108 is formed at the second insulating layer 106 by using a plating method, and the third insulating layer 107 and the wiring 110 are formed on the second insulating layer 106 formed with the wiring 108.

First, in order to form the wiring 108 at the second insulating layer 106, the via plug portion 108a is formed at the opening portion 106A of the second insulating layer 106, and the pattern wiring portion 108b is formed on the second insulating layer 106.

Specifically, a seed layer is formed on the second insulating layer 106 by electroless plating, thereafter, a resist pattern (not illustrated) is formed on the second insulating layer 106 by way of the seed layer by a photolithography method. Next, electricity is fed from the seed layer by constituting a mask by the resist pattern, Cu is precipitated by electrolytic plating, thereafter, the resist pattern and unnecessary seed layer are removed. Thereby, the wiring 108 including the via plug portion 108a and the pattern wiring portion 108b is formed.

Successively, the third insulating layer 107 and the wiring 110 are formed. First, the third insulating layer 107 (build-up layer) made of epoxy resin or the like having a thermosetting property is formed on the second insulating layer 106 and on the wiring 108. Next, a via hole (opening portion) is formed at the third insulating layer 107 by using, for example, laser.

Next, a seed layer is formed on the third insulating layer 107 by electroless plating, thereafter, a resist pattern (not illustrated) is formed on the third insulating layer 107 by way of the seed layer by a photolithography method. Further, electricity is fed from the seed layer by constituting a mask by the resist pattern, Cu is precipitated by electrolytic plating, thereafter, the resist pattern and the unnecessary seed layer are removed. Thereby, the wiring including the via plug portion 110a and the electrode portion 110b is formed.

Next, the solder resist 109 is formed on the third insulating layer 107 by a method of laminating or coating a photosensitive resin film. Next, the solder resist 109 is patterned by irradiating ultraviolet ray thereto by way of a mask pattern (not illustrated) and exposing the solder resist 109 to form the opening portion 109A. A position of forming the opening portion 109A is selected to a position of being opposed to the electrode portion 110b, thereby, there is brought about a state of exposing the electrode portion 110b from the opening portion 109A as described above. Further, the solder resist 109 having the opening portion 109A may be formed by printing a thermosetting resin material of epoxy or the like by a screen printing method.

Next, the support board 101 is removed by etching (for example, wet etching) from a state shown in FIG. 3E. The etching processing is carried out by using an etching solution which dissolves only the support board 101 and does not dissolve the electrode 103. At this occasion, the etching is carried out by closing the opening portion 109A by a resist or the like and therefore, the electrode portion 110b is not destructed by the etching.

Further, when a semiconductor element is mounted to the multilayered wiring board 100, there may be constructed a constitution of mounting the semiconductor element at the electrode portion 110b previously before removing the support board 101 and removing the support board 101 thereafter.

By carrying out the above-described series of steps, the multilayered wiring board 100 shown in FIG. 2 is fabricated. In the method of fabricating the multilayered wiring board-100 according to the embodiment, in forming the second insulating layer 106, by simply changing a used resin material to a resin including the reinforcing member, the second insulating layer 106 can be formed.

Further, according to the fabricating method of the embodiment, when the first insulating layer 104 and the wiring 105 are formed, the first insulating layer 104 and the wiring 105 are supported by the support board 101 and therefore, warp is not brought about. Further, after forming the first insulating layer 104 and the wiring 105, the second insulating layer 106 having the high mechanical strength is laminated to be formed, and the third insulating layer 107 and the wiring 110 are supported on the second insulating layer 106 having the high mechanical strength. Therefore, the third insulating layer 107 and the wiring 110 are supported by the second insulating layer 106 and therefore, also in forming the third insulating layer 107 and the wiring 110, warp is not brought about. Therefore, according to the fabricating method according to the embodiment, warp can be prevented from being brought about at the multilayered wiring board 100.

Further, also in arranging the insulating layer including the reinforcing member (second insulating layer 106 in the case of the embodiment) made of the resin including the reinforcing member at the laminating center, when a number of laminating of the multilayered wiring board 100 is previously determined, the laminating center can easily be determined. Therefore, the insulating layer including the reinforcing member can easily be disposed at the laminating center.

Further, the multilayered wiring board 100 constituted by thin-sized formation without warp can be fabricated by simply changing the material (resin) without significantly changing the steps of fabricating the multilayered wiring board which has been carried out in the prior art and therefore, a reduction in equipment cost can also be achieved. Further, in accordance therewith, a reduction in cost of the multilayered wiring board 100 can also be achieved.

Further, according to the method of fabricating the multilayered wiring board 100 according to the embodiment, a so-to-speak coreless structure is realized by removing the support board 101. Therefore, thin-sized formation of the multilayered wiring board 100 can be realized.

An explanation will be given here of warp brought about at the multilayered wiring board 100 according to the embodiment in comparison with the prior art in reference to FIGS. 4 and 5.

Figure 4:
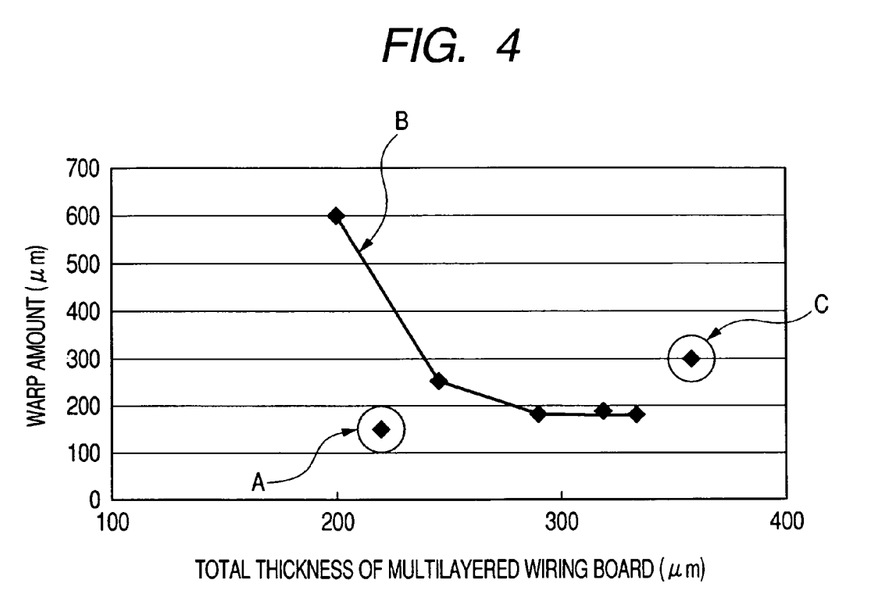
FIG. 4 is a diagram showing a relationship between a total thickness and a warp amount of a multilayered wiring board.
Figure 5A:
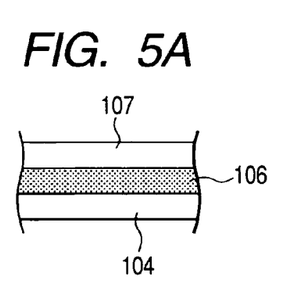
FIGS. 5A to 5C illustrate views showing multilayer structures of respective multilayered wiring boards shown in FIG. 4.

FIG. 4 shows a warp amount at the ordinate and shows a total thickness of a multilayered wiring board at the abscissa. What is shown in FIG. 4 by an arrow mark A is a property of the multilayered wiring board 100 according to the embodiment. That is, according to the multilayered wiring board, as schematically shown in FIG. 5A, the second insulating layer 106 (layer having high mechanical strength) is disposed at the laminating center by being arranged between the first insulating layer 104 and the third insulating layer 107.

Figure 5B:
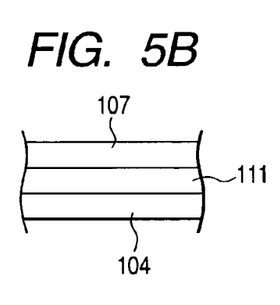
Figure 5C:
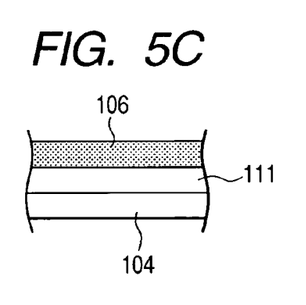

In contrast thereto, what is shown in FIG. 4 by an arrow mark B shows a property when all of the insulating layers 104, 111, 107 are constituted by the same layers (layers which are not provided with the mechanical strength) as schematically shown in FIG. 5B. Further, what is shown by an arrow mark C in FIG. 4 shows a property when the insulating layer 106 having the mechanical strength is arranged to be deviated from the laminating center as is schematically shown in FIG. 5C.

In a case in which the reinforcing member is not used in all of the layers as shown by the arrow mark B, there is shown a property in which the thicker the total thickness of the multilayered wiring board, the smaller the warp. In contrast thereto, in a case in which the layer including the reinforcing member is deviated from the laminating center as shown by the arrow mark C, it is known that large warp is brought about even when the total thickness of the multilayered wiring board is thick.

In contrast thereto, when the layer including the reinforcing member is arranged at the laminating center as in the embodiment, even when the total thickness of the multilayered wiring board is thin, occurrence of warp is restrained to be small since the balance centering on the second insulating layer 106 is excellent. Therefore, it is verified from FIG. 4 that according to the multilayered wiring board 100 according to the embodiment, occurrence of warp can be restrained while achieving a thin-sized formation.

Further, the thickness of the second insulating layer 106 becomes thicker than those of the other insulating layers 104, 107 since the second insulating layer 106 is mixed with the reinforcing member. However, when the thickness is made to be thick more than necessary, the thin-sized formation constituting the problem cannot be achieved. Warp can be reduced when the thickness of the insulating layer 106 used in FIG. 5A is 100 μm and therefore, it is preferable that the thickness of the insulating layer 106 is equal to or smaller than about 100 μm (specifically, about 15 through 100 μm). Further, it is preferable that the thicknesses of the normal insulating layers 104, 107 are about 15 through 35 μm.

Meanwhile, FIG. 6 shows various modified examples of a multilayer structure of a multilayered wiring board. Multilayered wiring boards shown in FIGS. 6A to 6E are provided with a structure of laminating 7 layers of insulating layers and constructed by a constitution of interposing insulating layers 116 including reinforcing members at portions or a total thereof. Further, in the following explanation, the layers are designated as first layer, a second layer, . . . a seventh layer from a lower layer.

Figure 6A:
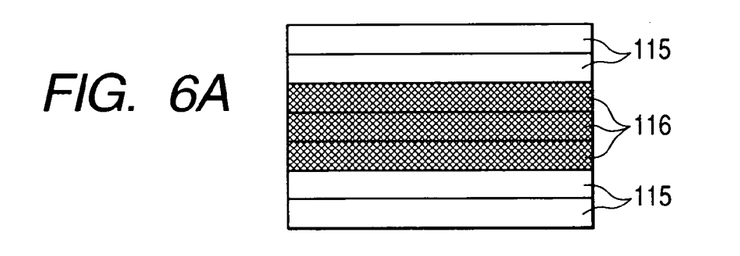
FIGS. 6A to 6E illustrate views showing various modified examples of a multilayer structure of a multilayered wiring board.

According to the multilayered wiring board shown in FIG. 6A, the third layer through the fifth layer disposed at a center are constituted by the insulating layers 116 including the reinforcing members. Further, the multilayered wiring board shown in FIG. 6B is constructed by a constitution of constituting the first layer and the seventh layer by the insulating layers 116 including the reinforcing members and the second layer through the sixth layer disposed therebetween are constituted by normal insulating layers 115.

Figure 6B:
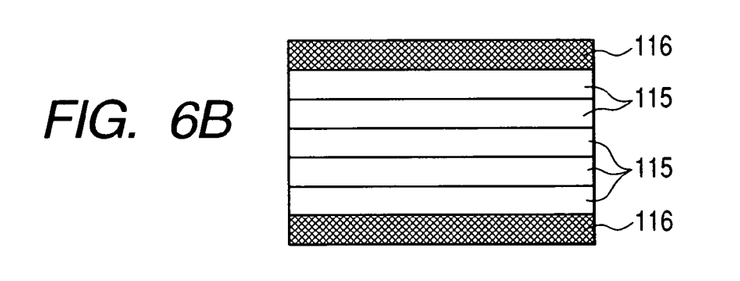
Figure 6C:
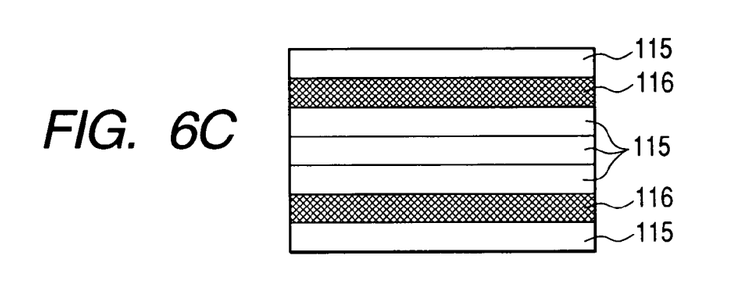

Further, a multilayered wiring board shown in FIG. 6C is constructed by a constitution of constituting the second layer and the sixth layer by the insulating layers 116 including the reinforcing members and constituting the other layers by the normal insulating layers 115. Further, according to the multilayered wiring board shown in FIG. 6D, the first layer and the seventh layer disposed at a top and a bottom thereof are constituted by the insulating layers 116 including the reinforcing members and the center fourth layer is constituted by the insulating layer 116 including the reinforcing member.

Figure 6D:
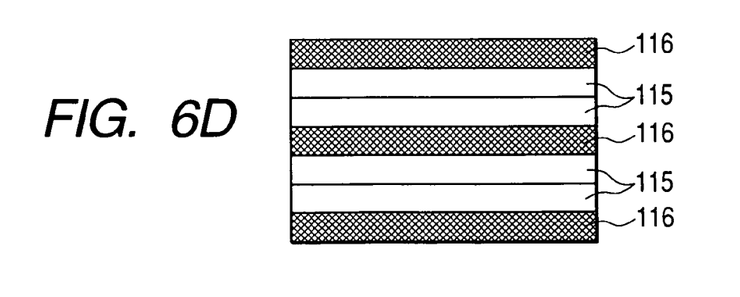

Also in the respective multilayered wiring boards shown in FIGS. 6A to 6D, the respective layers laminated by 7 layers are balanced and occurrence of warp can be restrained. Particularly, constitutions of providing the insulating layer 116 including the reinforcing member at the laminating center of the multilayered wiring boards as shown in FIGS. 6A, 6D, or providing the insulating layers 116 including the reinforcing members at both upper and lower faces of the multilayered wiring boards as shown in FIGS. 6B, 6D are preferable in view of preventing occurrence of warp.

Figure 6E:
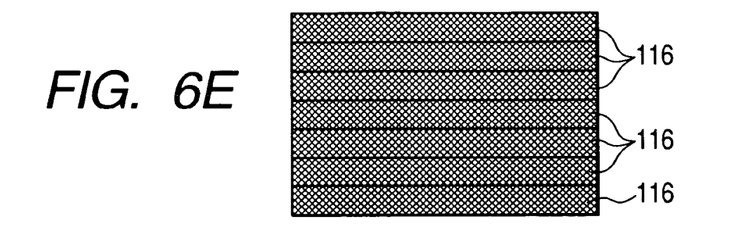

Further, as shown in FIG. 6E, there may be constructed a constitution in which all of the laminated insulating layers of the first layer through the seventh layer are constituted by the insulating layers 116 including the reinforcing members. In this case, an effect of restraining warp of the multilayered wiring board is further increased. For example, when there is a concern of increasing warp of the multilayered wiring board in consideration of a stress of a material or the like used in the multilayered wiring board, a number of laminated layers, thicknesses of layers and the like, as shown in FIG. 6E, it is preferable to constitute all of the laminated insulating layers by the insulating layers including the reinforcing members. Further, although in the above-described explanation of the embodiment, an explanation has been given such that a side of the third insulating layer 107 of the multilayered wiring board 100 is made to constitute a face of mounting the semiconductor element, and a side of the first insulating layer 104 is made to constitute a face of being arranged with external connection terminal, there may be constructed a constitution in which the side of the first insulating layer 104 is made to constitute the face of mounting the semiconductor element, and the side of the third insulating layer 107 is made to constitute the face of being arranged with the external connection terminal.

Further, although according to the method of fabricating the multilayered wiring board 100, an explanation has been given by illustrating a procedure of fabricating one piece of the multilayered wiring board 100 from one piece of the support board 101, actually, a so-to-speak multimember piece taking is carried out. That is, by integrally forming a number of the multilayered wiring boards 100 on one of the support board 101, and cutting and segmenting the number of multilayered wiring boards 100, the individual multilayered wiring boards 100 are formed. Thereby, a fabrication efficiency can be promoted.

Further, although according to the embodiment, a method of fabricating the multilayered wiring board 100 by using one sheet of the support board 101 is shown, as disclosed in, for example, Patent Reference 1, the multilayered wiring board may be formed by using two sheets of the support boards and constituting the support boards by a compound board laminated with two sheets of the support boards. Further, there may be constructed a constitution of constituting an electrode portion by a bump structure as disclosed in Patent Reference 1.

Further, the fabricating method of fabricating the multilayered wiring board 100 is not limited to the method shown in FIG. 3 (hereinafter, fabricating method 1) but the multilayered wiring board 100 can be fabricated by, for example, various methods shown below.

FIGS. 7A, 7B, 8 and 9 show a fabricating method 2 constituting a modified example of the fabricating method 1 by following a procedure thereof. However, portions explained above are attached with the same notations and an explanation thereof will be omitted. Further, portions which are not particularly explained are made to be similar to those of the fabricating method 1.

Figure 7A:
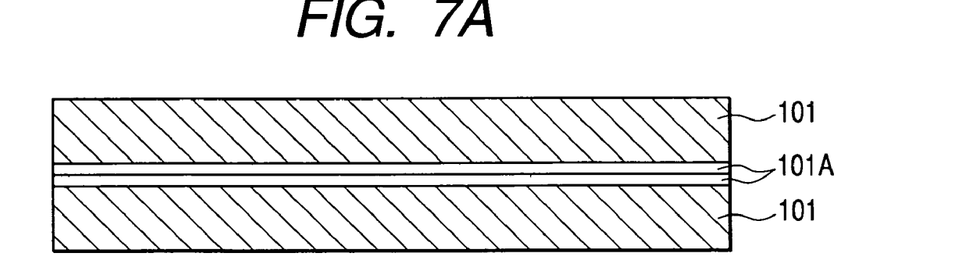
FIGS. 7A and 7B illustrate views showing a modified example of a fabricating method of FIG. 3 (part 1).

First, at a step shown in FIG. 7A, two sheets of the support boards 101 are pasted together by using an adhering layer 101A made of, for example, a resin material.

Figure 7B:
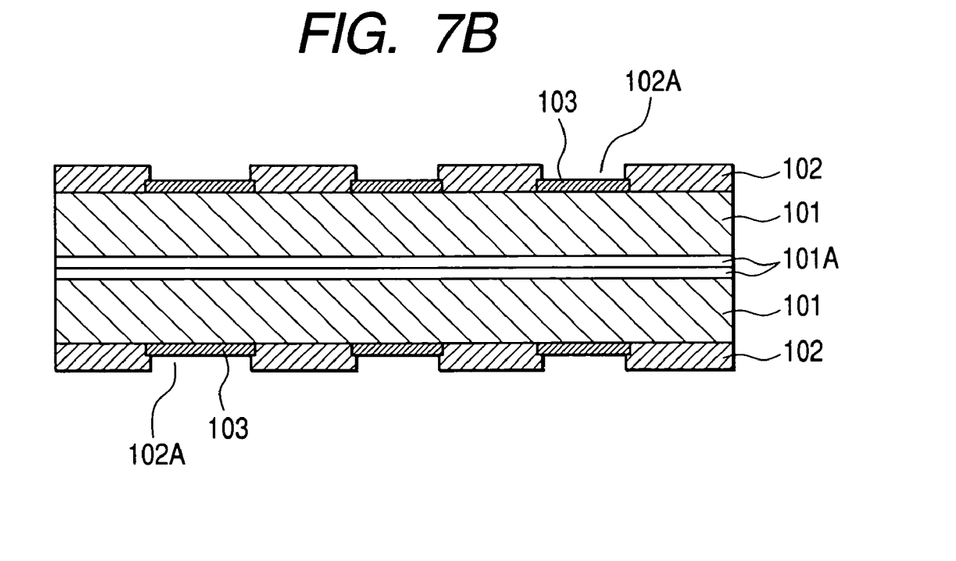

Next, at a step shown in FIG. 7B, a step in correspondence with FIG. 3B of the fabricating method 1 is carried out to form the solder resist layers 102 having the opening portion 102A and the electrodes 103 respectively at two sheets of the support boards 101 pasted together.

Figure 8:
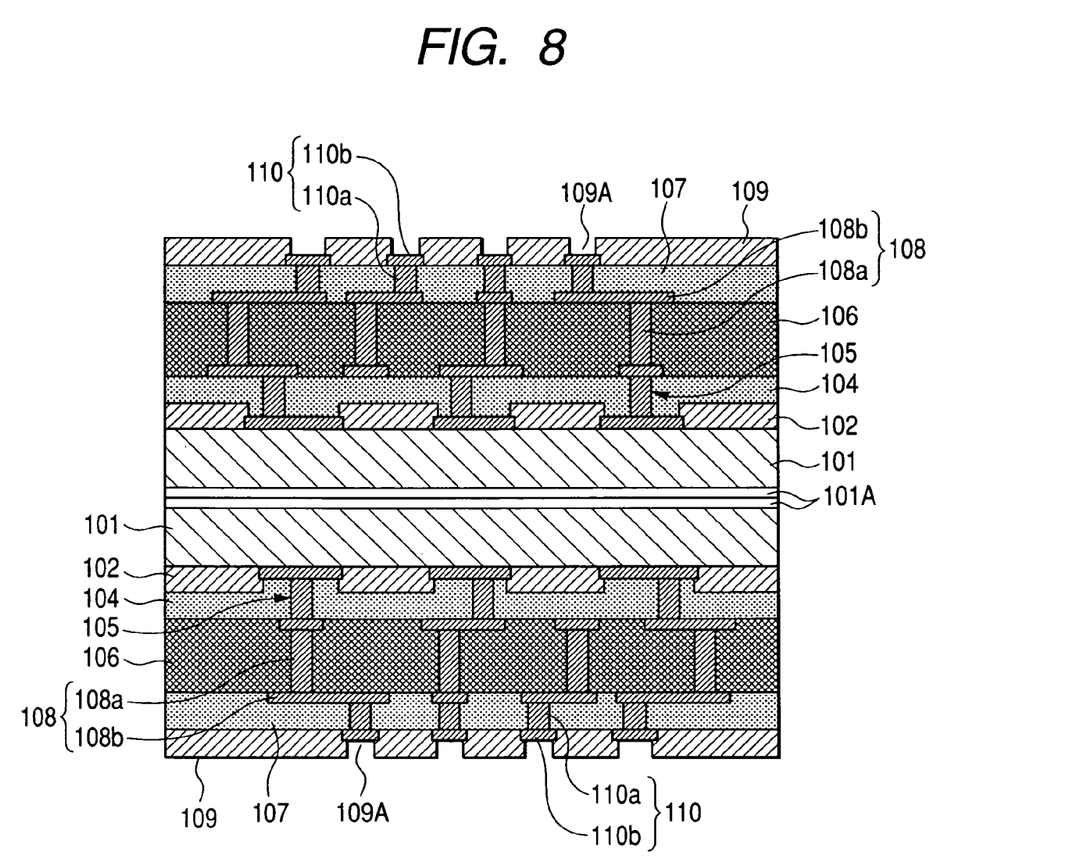
FIG. 8 is a view showing the modified example of the fabricating method of FIG. 3 (part 2).

Next, at a step shown in FIG. 8, steps in correspondence with FIGS. 3C to 3E of the fabricating method 1 are carried out, and the multilayered wiring boards are respectively formed at two sheets of the support boards 101. As a result, as shown in FIG. 8, there is formed a structure in which the multilayered wiring boards are respectively formed at two sheets of the support boards 101 pasted together.

Figure 9:
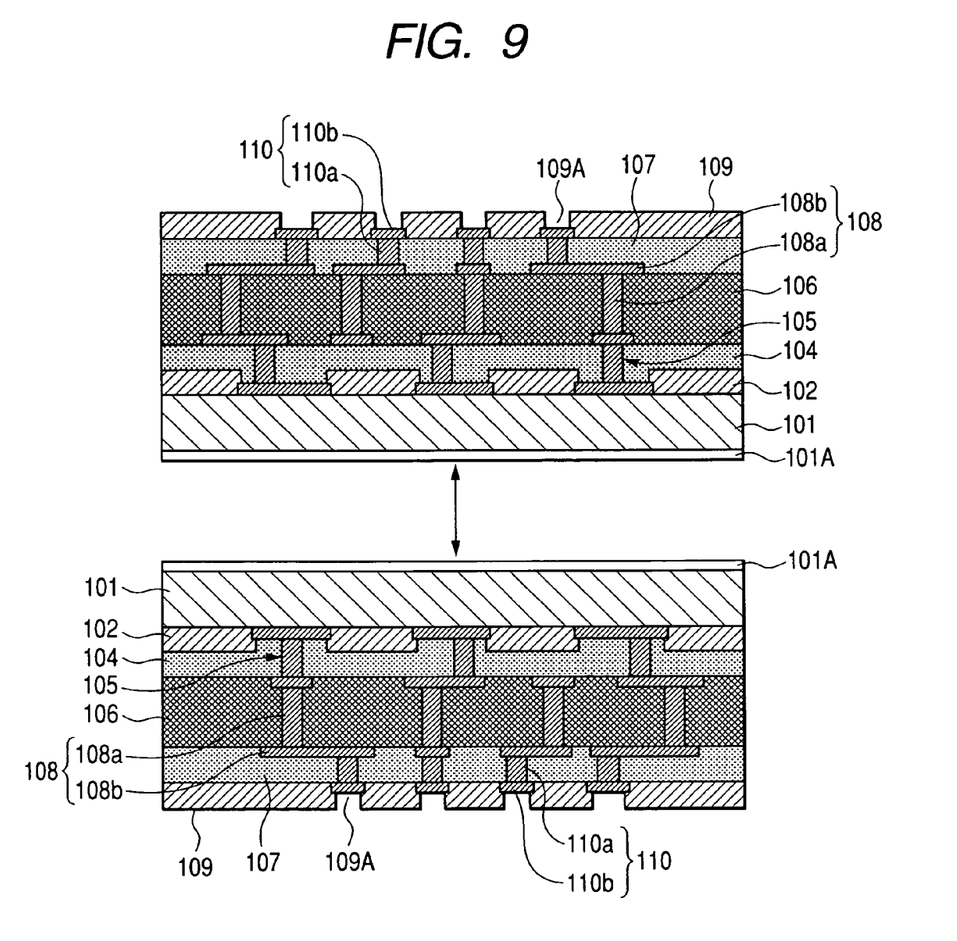
FIG. 9 is a view showing the modified example of the fabricating method of FIG. 3 (part 3).

Next, in the step shown in FIG. 9, two sheets of the support boards 101 pasted together are separated. Thereafter, by respectively removing two sheets of the support boards 101, the multilayered wiring boards 100 shown in FIG. 2 can be fabricated.

In the fabricating method 2, the multilayered wiring boards are formed at two sheets of the support boards and therefore, an efficiency of fabricating the multilayered wiring board is improved. Further, an amount of warp in the steps of forming the multilayered wiring board is restrained and the multilayered wiring board can be fabricated by excellent working accuracy.

Further, FIGS. 10A, 10B, 11 and 12 show a fabricating method 3 constituting other modified example of the fabricating method 1 by following a procedure thereof. However, portions explained above are attached with the same notations and an explanation thereof will be omitted. Further, portions which are not explained particularly are made to be similar to those of the fabricating method 1.

Figure 10A:
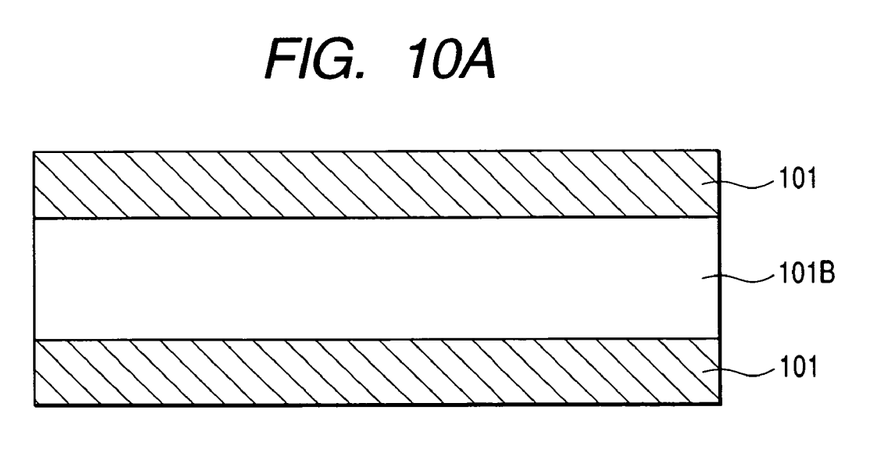
FIGS. 10A and 10B illustrate views showing other modified example of the fabricating method of FIG. 3 (part 1).

First, at the step shown in FIG. 10A, two sheets of the support boards 101 are pasted to both faces of a holding board 101B. The holding board 101B is made of, for example, a resin material and holds two sheets of the support boards 101 by being pasted with the support boards 101B made of metal foils of copper or the like at both faces thereof.

Further, although the support board 101 is pasted to the holding board 101B by, for example, an adhering agent, in the drawing, illustration of the adhering agent is omitted. For example, the adhering agent is used at a peripheral edge portion of the support board (holding board), and the support board can be separated from the holding board by removing the peripheral edge portion using the adhering agent by dicing at later step.

Figure 10B:
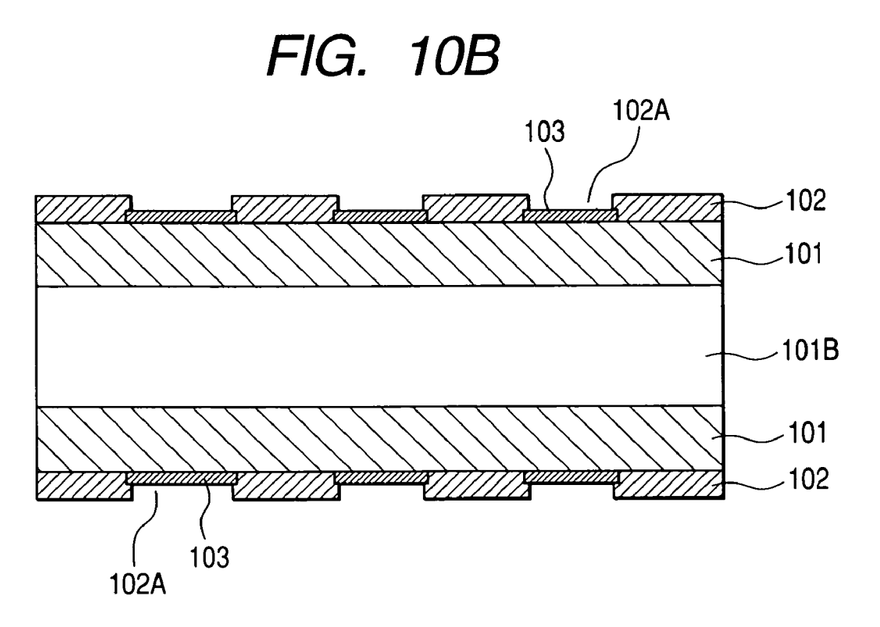

Further, at a step shown in FIG. 10B, a step in correspondence with FIG. 3B of the fabricating method 1 is carried out and the solder resist layers 102 having the opening portions 102A and the electrodes 103 are respectively formed at two sheets of the support boards 101 pasted to the holding board 101B.

Figure 11:
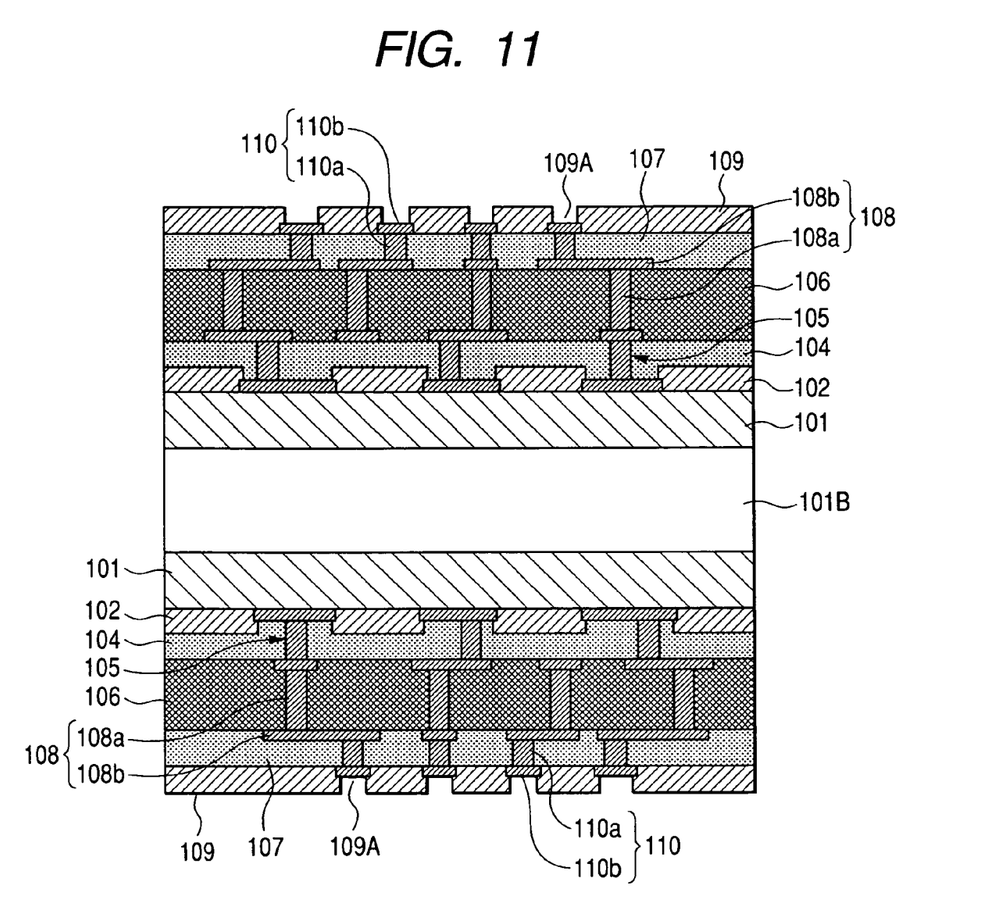
FIG. 11 is a view showing other modified example of the fabricating method of FIG. 3 (part 2).

Next, at a step shown in FIG. 11, steps in correspondence with FIGS. 3C to 3E of the fabricating method 1 are carried out, and the multilayered wiring boards are respectively formed at two sheets of the support boards 101. As a result, as shown in FIG. 11, there is formed a structure constituted by forming the multilayered wiring boards respectively at two sheets of the support boards 101 pasted to the holding board 101B.

Figure 12:
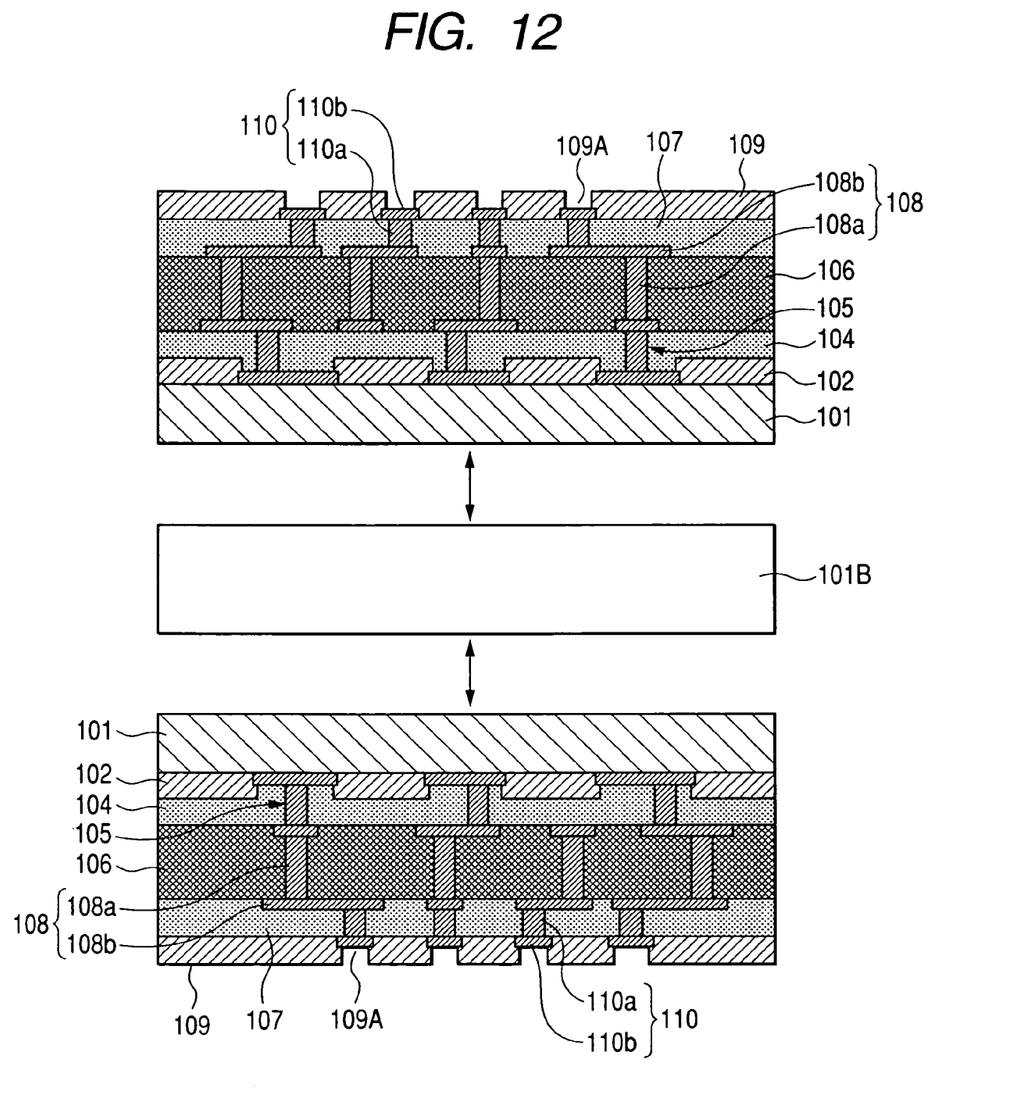
FIG. 12 is a view showing other modified example of the fabricating method of FIG. 3 (part 3).

Next, at a step shown in FIG. 12, two sheets of the support boards 101 pasted to the holding board 101B are respectively exfoliated. In this case, as explained above, the support board 101 can be exfoliated from the holding board 101B by, for example, deleting the peripheral edge portions of the holding board 101B and the support board 101 adhered by the adhering agent by dicing.

Thereafter, by respectively removing two sheets of the support boards 101, the multilayered wiring boards 100 shown in FIG. 2 can be fabricated.

According to the fabricating method 3, similar to the case of the fabricating method 2, the multilayered wiring boards are formed at two sheets of the support boards and therefore, the efficiency of fabricating the multilayered wiring board is improved. Further, the amount of warp in steps of forming the multilayered wiring board is restrained and the multilayered wiring board can be fabricated with excellent working accuracy.

Further, the multilayered wiring board 100 shown in FIG. 2 is mounted with the semiconductor chip to be connected to the electrode portion 10B. In this case, the semiconductor chip may be mounted before removing the support board 101.

Figure 13A:
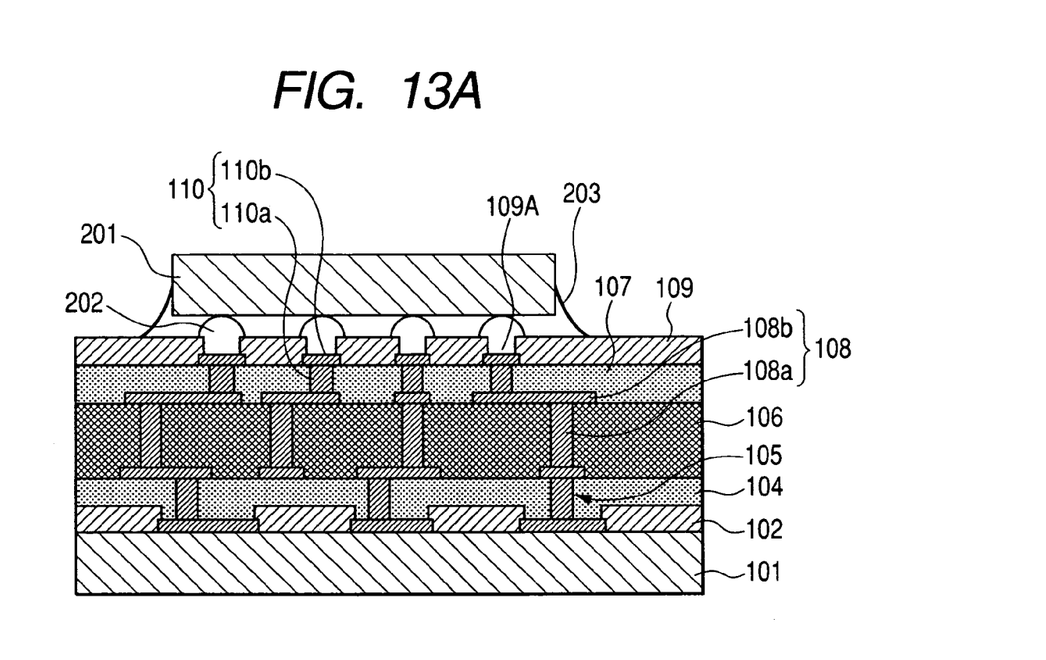
FIGS. 13A and 13B illustrate views showing a method of mounting a semiconductor chip to the multilayered wiring board of FIG. 2.
Figure 13B:
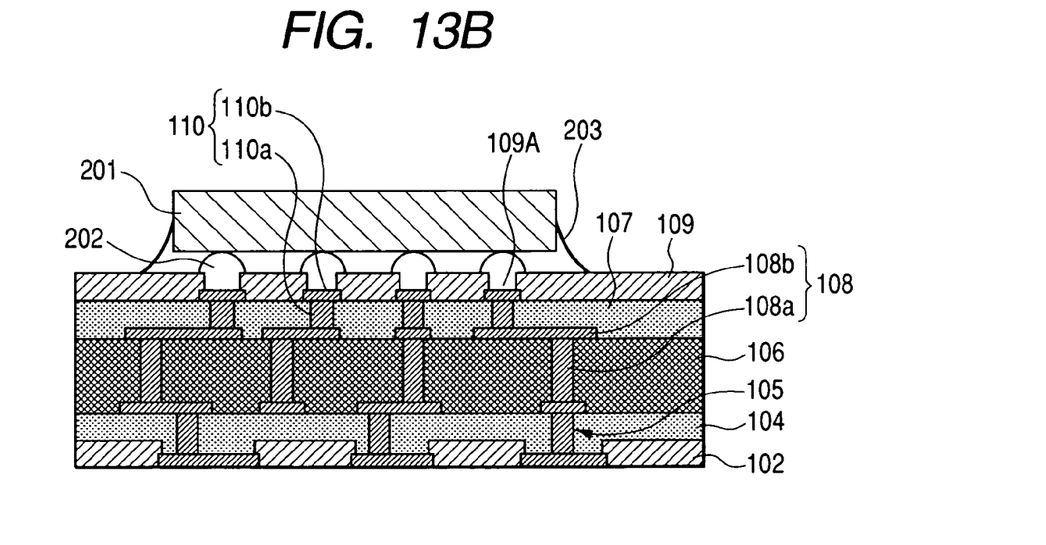

FIGS. 13A and 13B are views showing an example of a method of mounting the semiconductor chip to the multilayered wiring board 100. However, there is a case in which the portions explained above are attached with the same notations and an explanation thereof will be omitted.

At a step shown in FIG. 13A, a semiconductor chip 201 is mounted to an electrode portion 110B by a flip chip by using a solder connecting portion (solder ball) 202 before removing the support board 101 from a state shown in any of, for example, FIG. 3E, 9 or 12. Further, an underfill resin 203 is infiltrated to be cured between the semiconductor chip 201 and the solder resist 109.

Next, at the step shown in FIG. 13B, the support board 101 is removed by etching (for example, west etching). In this way, the multilayered wiring board mounted with the semiconductor chip can be fabricated.

According to the above-described method, the semiconductor chip is mounted in a state of supporting the multilayered wiring board by the support board and therefore, the semiconductor chip is mounted in a state in which flatness of the multilayered wiring board is excellent. Therefore, an effect of improving reliability of mounting the semiconductor chip is achieved. Further, the semiconductor chip may be mounted after removing the support board.

Further, a number of layers of the multilayered wiring board or leading wirings, or a mode of mounting the semiconductor chip (for example, flip chip mounting, mounting by wire bonding, or a combination of these) can variously be modified or changed.

Although the invention has been explained with regard to the preferable embodiments as mentioned above, the invention is not limited to the specific embodiments but can variously be modified or changed within the gist described in the scope of claims.

What is claimed is:

1. A multilayered wiring board comprising:
wiring layers; and
insulating layers, wherein
the wiring layers and the insulating layers are laminated to form a plurality of layers;
at least one of the insulating layers is an insulating layer including a reinforcing member; and
the wiring layers and the insulating layers not including reinforcing members are symmetrically arranged with respect to the insulating layer including a reinforcing member, wherein the thickness of the at least one insulating layer including a reinforcing member is equal to or smaller than about 100 µm.

2. The multilayered wiring board according to claim 1, wherein
the insulating layer including a reinforcing member is a woven cloth or a nonwoven cloth impregnated by a resin.

3. The multilayered wiring board according to claim 1, wherein the insulating layers are formed by a resin.

4. The multilayered wiring board according to claim 1, wherein the insulating layer including a reinforcing member is a resin mixed with the reinforcing member.

5. The multilayered wiring board according to claim 1, wherein
the plurality of laminated insulating layers are the laminated insulating layers including reinforcing members.

6. The multilayered wiring board according to claim 1, wherein
the thickness of the at least one insulating layer including a reinforcing member is about 15 through 100 µm.

7. The multilayered wiring board according to claim 1, wherein
the at least one insulating layer comprising a reinforcing member is laminated at the center of the multilayered wiring board.

8. The multilayered wiring board according to claim 1, wherein
insulating layers comprising reinforcing members are laminated at the outermost of the multilayered wiring board.

9. The multilayered wiring board according to claim 1, wherein
insulating layers comprising reinforcing members are laminated symmetrically with respect to an insulating layer at the center of multilayered wiring board; and
insulating layers laminated at other portions do not comprise reinforcing members.

10. The multilayered wiring board according to claim 1, wherein
insulating layers comprising reinforcing members are laminated at the center and at the outermost of the multilayered wiring board.

11. The multilayered wiring board according to claim 1, wherein
each of the insulating layers comprises a reinforcing member.

12. A method of fabricating a multilayered wiring board comprising the steps of:
repeatedly forming a wiring and an insulating layer by using a resin on a support board, and
removing the support board, wherein
in the steps of forming the insulating layers, at least one of the insulating layers is formed by a resin including a reinforcing member; and
the wiring layers and the insulating layers not including reinforcing members are symmetrically arranged with respect to the insulating layer including a reinforcing member, wherein the thickness of the at least one insulating layer including a reinforcing member is egual to or smaller than about 100 μm.

13. The method of fabricating a multilayered wiring board according to claim 12, wherein the insulating layers are made by a build-up resin.

14. The method of fabricating a multilayered wiring board according to claim 12, further comprising the steps of:
pasting together two sheets of support boards; and
separating the two sheets of support boards respectively formed with the insulating layers and the wirings.

15. The method of fabricating a multilayered wiring board according to claim 12, further comprising the steps of:
respectively pasting two sheets of support boards to a first face and a second face of a holding board holding the two sheets of the support boards; and
separating the two sheets of the support boards respectively formed with the insulating layers and the wirings from the holding board.

16. The method of fabricating a multilayered wiring board according to claim 12, further comprising the step of:
mounting a semiconductor chip to the multilayered wiring board.

17. The method of fabricating a multilayered wiring board according to claim 16, wherein
the step of removing the support board is carried out after the step of mounting the semiconductor chip.

18. The method of fabricating a multilayered wiring board according to claim 12, wherein
the thickness of the at least one insulating layer including a reinforcing member is about 15 through 100 μm.

19. The method according to claim 12, wherein
the insulating layer comprising a reinforcing member is laminated at the center of the multilayered wiring board.

20. The method according to claim 12, wherein
insulating layers comprising reinforcing members are laminated at the outermost of the multilayered wiring board.

21. The method according to claim 12, wherein
insulating layers comprising reinforcing members are laminated symmetrically with respect to an insulating layer at the center of multilayered wiring board; and
insulating layers laminated at other portions do not comprise reinforcing members.

22. The method according to claim 12, wherein
insulating layers comprising reinforcing members are laminated at the center and at the outermost of the multilayered wiring board.

23. The method according to claim 12, wherein
each of the insulating layers comprises a reinforcing member.

* * * * *